(12) United States Patent
Furuhata et al.

(10) Patent No.: US 7,400,219 B2
(45) Date of Patent: *Jul. 15, 2008

(54) SURFACE ACOUSTIC WAVE DEVICE AND METHOD OF MANUFACTURING A SURFACE ACOUSTIC WAVE DEVICE

(75) Inventors: Makoto Furuhata, Suwa (JP); Hisakatsu Sato, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 215 days.

This patent is subject to a terminal disclaimer.

(21) Appl. No.: 11/290,570

(22) Filed: Dec. 1, 2005

(65) Prior Publication Data
US 2006/0131993 A1 Jun. 22, 2006

(30) Foreign Application Priority Data
Dec. 21, 2004 (JP) ............................. 2004-368866
Aug. 29, 2005 (JP) ............................. 2005-247275

(51) Int. Cl.
*H03H 3/08* (2006.01)
*H03H 9/25* (2006.01)

(52) U.S. Cl. .................... 333/193; 310/313 R; 257/416

(58) Field of Classification Search ......... 333/193–196; 310/313 R, 313 B, 313 C; 257/416
See application file for complete search history.

(56) References Cited
U.S. PATENT DOCUMENTS
5,621,364 A * 4/1997 Ruile et al. ................. 333/195

6,285,866 B1 * 9/2001 Lee et al. .................... 455/318
6,894,598 B2 5/2005 Heima
2002/0149019 A1 10/2002 Iwashita et al.

FOREIGN PATENT DOCUMENTS
JP A 58-139518 8/1983
JP A 61-94409 5/1986

(Continued)

OTHER PUBLICATIONS

Kim et al., "Improved IC-Compatible Piezoelectric Microphone and CMOS Process", Solid-State Sensors & Actuators, 1991. Diegest of Technical Papers, Transducers '91. 1991 International Conference. Jun. 24-27, 1991, pp. 270-271.*

(Continued)

*Primary Examiner*—Seungsook Ham
(74) *Attorney, Agent, or Firm*—Oliff & Berridge, PLC (57) ABSTRACT

A surface acoustic wave (SAW) device includes at least an IC region and a SAW element region. A semiconductor element layer and wiring layer is located in the IC region, and the semiconductor element layer has a semiconductor element and an element insulating film. The wiring layer is formed by stacking wiring to connect with the semiconductor element and a wiring insulating film extending to the SAW region. The semiconductor element layer further includes a piezoelectric thin film formed above the wiring insulating film, and in the SAW element region, a SAW element is formed on the piezoelectric thin film equipped with an IDT electrode provided with a plurality of electrode fingers, and at least one layer of layer thickness adjusting films having linear shapes and arranged in parallel to and with the same pitch as the electrode fingers of the IDT electrode.

8 Claims, 5 Drawing Sheets

FOREIGN PATENT DOCUMENTS

| | | |
|---|---|---|
| JP | A 6-97315 | 4/1994 |
| JP | A 11-068496 | 3/1999 |
| JP | A 11-330899 | 11/1999 |
| JP | A 2000-183688 | 6/2000 |
| JP | A 2004-221475 | 8/2004 |

OTHER PUBLICATIONS

J.H. Visser et al.; Surface Acoustic Wave Filters In ZnO-SiO2-Si Layered Structures; Ultrasonics Symposium pp. 195-200 [1989].

Widdman et al.; "Technologie hochintergrierter Schaltungen;" 1996; pp. 35, 67, 68, 71-74, 96, 97, 183-186, 269-277, 297-302, 307 & 308.

Campbell, C.K.; "Surface Acoustic Wave Devices for Mobile and Wireless Communications;" 1998, pp. 55-63.

Vellekoop et al.; "Integrated-Circuit-Compatible Design and Technology of Acoustic-Wave-Based Microsensors;" Sensors and Actuators A, vol. A44, No. 3, Sep. 1, 1994; pp. 249-263.

Stine et al., "The Physical and Electrical Effects of Metal-Fill Patterning Practices for Oxide Chemical-Mechanical Polishing Processes," IEEE Transactions on Electron Devices, vol. 45, No. 3, Mar. 1998, pp. 665-679.

Nelson et al., "Optimizing Pattern Fill for Planarity and Parasitic Capacitance," 2004 IEEE/SEMI Advanced Semiconductor Manufacturing Conference, May 2004, pp. 115-118.

\* cited by examiner

SURFACE ACOUSTIC WAVE DEVICE AND METHOD OF MANUFACTURING A SURFACE ACOUSTIC WAVE DEVICE

BACKGROUND OF THE INVENTION

1. Technical Field

The present invention relates to a surface acoustic wave device provided with an IC region and a surface acoustic wave element region on a semiconductor substrate to form a single chip.

2. Related Art

Surface acoustic wave devices represented by a SAW resonator or a SAW filter have various superior characteristics such as high frequency, compact size, or high mass productivity, and therefore, are widely used in the telecommunications field. In recent years, along with the popularization of mobile telecommunication devices, downsizing and weight saving of components used in the high-frequency area are strongly desired.

To cope with the desire, as shown in a document of J. H. Viseer, IEEE, Ultrasonics Symposium, p.195-200 (1989), for example, there is proposed a surface acoustic wave device having a SAW filter formed by providing a piezoelectric thin film on a semiconductor substrate partially provided with a high-frequency amplifier circuit or the like instead of using a surface acoustic wave element as a filter unit.

In such a surface acoustic wave device equipped with an IC region and a surface acoustic wave region on a semiconductor substrate to form a single chip, semiconductor elements and wiring for connecting the semiconductor elements are formed via an insulating film as a multi-layered structure in the IC region. Since, in contrast, only the insulating film is stacked in the surface acoustic wave element region, a step is created between the IC region and the surface acoustic wave element region. Typically, in case of such a surface acoustic wave device, a large number of surface acoustic wave devices are formed in a semiconductor wafer so as to border on each other, and as layers such as the insulating layer are stacked, the step inclines and advances to the surface acoustic wave element region, this causes a problem that the flatness of the surface of the surface acoustic wave element region cannot be assured. If the flatness of the surface is not sufficient, the surface acoustic wave element cannot be manufactured with sufficient dimensional accuracy, which degrades the performance of the surface acoustic wave element. Further, the unevenness of the surface caused by the insufficient flatness causes a variation in the thickness of the piezoelectric thin film formed thereon, and a variation in the resonant frequency of the surface acoustic wave element is concerned.

SUMMARY

In view of the above technical background, an advantage of the present invention is to provide a surface acoustic wave device, which is equipped with an IC region and a surface acoustic wave element region in a semiconductor substrate and is configured as a single chip, and a method of manufacturing the surface acoustic wave device capable of ensuring evenness of the surface acoustic wave element region, and thus obtaining superior characteristics.

A surface acoustic wave device according to an aspect of the invention includes at least an IC region and a surface acoustic wave element region in a semiconductor substrate and is formed as a single chip, and includes in the IC region a semiconductor element layer having a semiconductor element and an element insulating film formed to cover the semiconductor element and extending to the surface acoustic wave element region, a wiring layer formed by stacking, on the semiconductor element layer, wiring for establishing connection with the semiconductor element and a wiring insulating film extending to the surface acoustic wave element region and for insulating the wiring, a piezoelectric thin film formed above the wiring insulating film. And the surface acoustic wave device further includes, in the surface acoustic wave element region, a surface acoustic wave element formed on the piezoelectric thin film and equipped with an IDT electrode provided with a plurality of electrode fingers, and at least one layer of layer thickness adjusting films having linear shapes and arranged in parallel to the electrode fingers of the IDT electrode and with the same pitch as the electrode fingers of the IDT electrode. The layer thickness adjusting films are formed above the semiconductor substrate, the element insulating film, or the wiring insulating film, and below an area in which the surface acoustic wave element is formed.

According to this configuration, the step between the IC region and the surface acoustic wave element region can be reduced by providing the layer thickness adjusting films on the semiconductor substrate, the element insulating film, or the wiring insulating film in the surface acoustic wave element region, thus evenness of the surface acoustic wave element region can be ensured. Further, the diffused reflection of the surface acoustic wave excited by the IDT electrodes can be prevented by providing the layer thickness adjusting films having linear shapes substantially in parallel to and with the same pitch as the electrode fingers of the IDT electrodes.

As described above, the surface acoustic wave element can be formed in the even surface acoustic wave element region to form the IDT electrodes with good dimensional accuracy to reduce variation in the resonant frequency of the surface acoustic wave element, and further to prevent the diffused reflection of the surface acoustic wave, thus the surface acoustic wave device with superior characteristics can be provided.

In the surface acoustic wave device according to another aspect of the invention, the layer thickness adjusting films are formed in the same pitch as the pitch of the electrode fingers with respect to positions where the center lines of the electrode fingers in the line width direction match the respective center lines of the layer thickness adjusting films in the line width direction. According to this configuration, the diffused reflection of the surface acoustic wave can effectively be prevented, thus providing the surface acoustic wave element with good characteristics.

In the surface acoustic wave device according to still another aspect of the invention, the width of each of the electrode fingers is equal to the width of respective one of the layer thickness adjusting films. According to this configuration, the diffused reflection of the surface acoustic wave can further effectively be prevented, thus providing the surface acoustic wave element with good characteristics.

In the surface acoustic wave device according to another aspect of the invention, each of the layer thickness adjusting films has a shape composed of discontinuous lines. According to this configuration, the layer thickness adjusting films can more easily be formed, and freedom of designing the layer thickness adjusting films can be increased.

The surface acoustic wave device according to still another aspect of the invention further includes a moisture resistant film between the wiring insulating film and the piezoelectric thin film. According to this configuration, the IC can be protected form an influence of moisture, thus providing the surface acoustic wave device with high reliability.

A method of manufacturing a surface acoustic wave device according to another aspect of the invention, the surface acoustic wave device including at least an IC region and a surface acoustic wave element region in a semiconductor substrate and formed as a single chip, includes the steps of (a) forming in the IC region of the semiconductor substrate a semiconductor element layer, the step (a) including the steps of (a1) providing a semiconductor element and (a2) providing an element insulating film covering the semiconductor element, (b) forming on the semiconductor element layer a wiring layer, the step (b) including the steps of (b1) providing wiring for establishing connection with the semiconductor element and (b2) providing a wiring insulating film for insulating the wiring stacked on the wiring. In this case, the step (a2) includes the step of forming in the surface acoustic wave element region the element insulating film composing the semiconductor element layer, and the step (b2) includes the step of forming in the surface acoustic wave element region the wiring insulating film composing the wiring layer in a stacked manner. The method further includes the steps of (c) forming a piezoelectric thin film above the wiring insulating film in the surface acoustic wave element region, (d) forming a surface acoustic wave element on the piezoelectric thin film in the surface acoustic wave element region, and (e) forming at least one layer of layer thickness adjusting films having linear shapes and arranged in parallel to and with the same pitch as electrode fingers. of an IDT electrode above one of the semiconductor substrate, the element insulating film, and the wiring insulating film, and below an area in which the surface acoustic wave element is formed.

According to this method of manufacturing a surface acoustic wave device, the step between the IC region and the surface acoustic wave element region can be reduced by providing the layer thickness adjusting films on the semiconductor substrate, the element insulating film, or the wiring insulating film in the surface acoustic wave element region, thus evenness of the surface acoustic wave element region can be ensured. Further, the diffused reflection of the surface acoustic wave excited by the IDT electrodes can be prevented by providing the layer thickness adjusting films having linear shapes substantially in parallel to and with the same pitch as the electrode fingers of the IDT electrodes.

As described above, the surface acoustic wave element can be formed in the even surface acoustic wave element region to form the IDT electrodes with good dimensional accuracy to reduce variation in the resonant frequency of the surface acoustic wave element, and further to prevent the diffused reflection of the surface acoustic wave, thus the method of manufacturing the surface acoustic wave device with superior characteristics can be provided.

In the method of manufacturing a surface acoustic wave device according to still another aspect of the invention, the step (b1) and the step (e) are executed simultaneously to form the layer thickness adjusting films with the wiring in the same layer.

According to this method of manufacturing the surface acoustic wave device, the layer thickness adjusting films can be formed with the wiring in the IC region in the common process, thus the layer thickness adjusting films can efficiently be formed.

The method of manufacturing the surface acoustic wave device according to still another aspect of the invention further includes the step of forming a moisture resistant film between the wiring insulating film and the piezoelectric thin film.

According to this method of manufacturing the surface acoustic wave device, the IC can be protected form an influence of moisture, thus providing the method of manufacturing the surface acoustic wave device with high reliability.

BRIEF DESCRIPTION OF THE DRAWINGS

The invention will now be described with reference to the accompanying drawings, wherein like numbers refer to like elements.

DESCRIPTION OF THE EMBODIMENTS

Hereinafter, embodiments of the invention will be described with reference to the accompanying drawings.

First Embodiment

Figure 1:
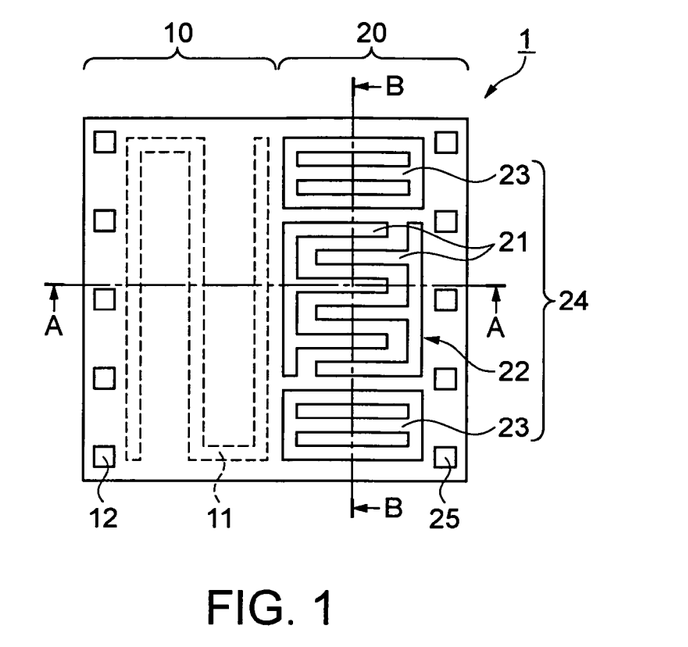
FIG. 1 is a schematic plan view showing a surface acoustic wave device according to an embodiment of the invention.

FIG. 1 is a schematic plan view showing a surface acoustic wave device according to an embodiment of the invention. A surface acoustic wave device 1 is provided with an IC region 10 and a surface acoustic wave element region 20 in a semiconductor substrate. In the IC region, a semiconductor element (shown in FIG. 2) is formed on the semiconductor substrate, and Al wiring 11 for connecting the semiconductor element is stacked thereon. And, Al pads 12 are provided for electrical connection with the outside. Further, a high-frequency circuit such as an oscillator circuit for driving the surface acoustic wave element 24 is included in the IC region 10.

In the surface acoustic wave element region 20, there is formed a SAW resonator as the surface acoustic wave element 24 equipped with IDT electrodes 22 and reflectors 23. The IDT electrodes 22 are equipped with electrode fingers 21 disposed so as to alternately engage with each other. And, Al pads 25 are provided for electrical connection with the outside. As described above, the semiconductor substrate is equipped with the IC region 10 and the surface acoustic wave element region 20 to configure the surface acoustic wave device 1 as a single chip.

Figure 2:
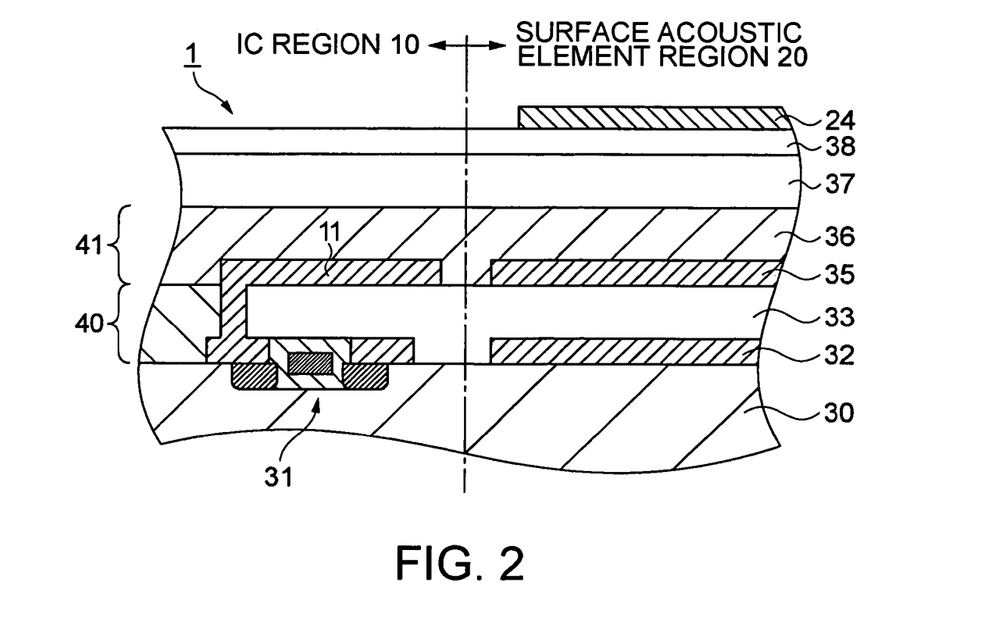
FIG. 2 is a schematic partial cross-sectional view of the surface acoustic wave device.

FIG. 2 is a schematic partial cross-sectional view along the A-A line in the surface acoustic wave device 1 shown in FIG. 1. In the IC region 10 on the semiconductor substrate 30 made of silicon, there are formed a large number of semiconductor elements 31 using a known method. Further, in the surface acoustic wave element region 20 on the semiconductor substrate 30, there is formed first layer thickness adjusting films 32 made of Al. And, an element insulating film 33 made of $SiO_2$ is formed on the semiconductor elements 31 and the first layer thickness adjusting films 32 to insulate the semiconductor elements 31. As described above, a semiconductor element layer 40 composed of the semiconductor elements 31 and the element insulating film 33 is formed in the IC region 10.

On the element insulating film 33 in the IC region 10, there is formed Al wiring 11 for connecting the semiconductor 31, and on the element insulating film 33 in the surface acoustic wave element region 20, there are formed second layer thickness adjusting films 35. The second layer thickness adjusting films 35 are provided using the same processes as the Al wiring 11, and are formed to have the same thickness as the Al wiring 11. And then, a wiring insulating film 36 made of $SiO_2$ is formed on the Al wiring 11. As described above, a wiring layer 41 composed of the Al wiring 11 and the wiring insulating film 36 is formed in the IC region 10. And then, a moisture resistant film 37 made of $Si_3N_4$ is formed on the wiring insulating film 36, and a piezoelectric thin film 38 made of ZnO is formed on the moisture resistant film 37. Further, on the piezoelectric thin film 38 in the surface acoustic wave element 20, there is formed a surface acoustic wave element 24 made of Al.

Figure 3:
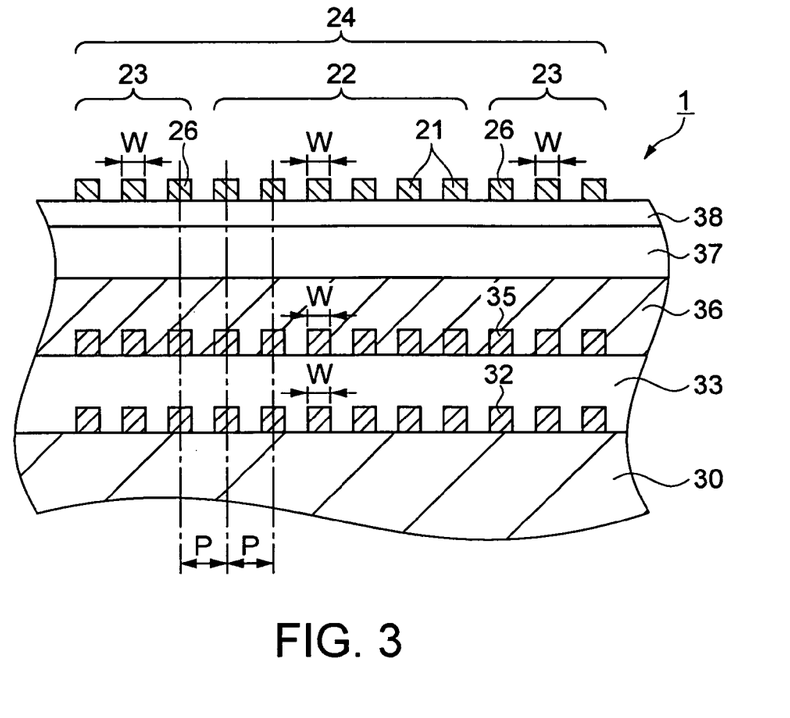
FIG. 3 is a schematic partial cross-sectional view of the surface acoustic wave device.
Figure 4:
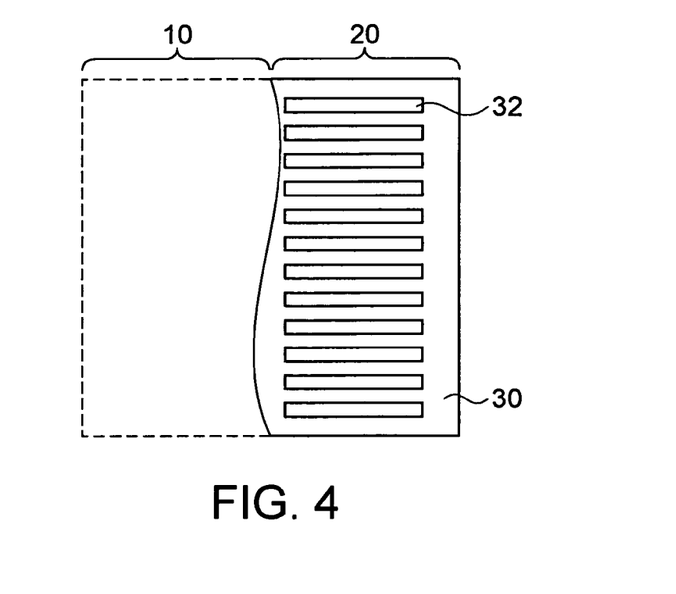
FIG. 4 is a schematic plan view showing a layout pattern of a set of layer thickness adjusting films.

Hereinafter, the layer thickness adjusting films will be described in detail. FIG. 3 is a schematic cross-sectional view along the B-B cutting line in FIG. 1, and FIG. 4 is a schematic plan view for showing a layout pattern of a set of the layer thickness adjusting films. In FIG. 4, the first layer thickness adjusting films 32 formed on the semiconductor substrate 30 are disposed on the surface acoustic wave element region 20, for example. The first layer thickness adjusting films 32 are formed linearly and substantially in parallel to the electrode fingers of the IDT electrode. Further, the second layer thickness adjusting films 35 are also disposed in the same shape as described above.

In FIG. 3, the IDT electrodes 22 are equipped with the electrode fingers 21, and the electrode fingers 21 are formed in series with a pitch P. Further, electrodes 26 of the reflectors 23 are also formed in the pitch P, thus forming the surface acoustic wave element 24 to have the shape having the electrodes aligned in series with the pitch P. And, the electrode fingers 21 and the electrodes 26 of the reflectors 23 are formed to have the same line width W. Here, assuming that the wavelength of the surface acoustic wave is $\lambda$, the pitch P is designed to satisfy the following equation. $P=\lambda/2$ The first layer thickness adjusting films 32 and the second layer thickness adjusting films 35 are formed to have the same pitch P as that of the electrode fingers 21 with respect to the positions having the same center lines of the respective electrode fingers 21 in the width direction. Further, the width W of each of the first layer thickness adjusting films 32 and the second layer thickness adjusting films 35 is formed to be the same as the width W of each of the electrode fingers 21. Note that, the area in which the first layer thickness adjusting films 32 and the second layer thickness adjusting films 35 are formed is formed to be equal to or wider than the area in which the surface acoustic wave element 24 is formed. Further, if the wiring layers are stacked to form a multi-layered structure, the step between the IC region 10 with the multi-layered structure and the surface acoustic wave element region 20 can be reduced by appropriately forming the layer thickness adjusting films having the same shapes as described above on the wiring insulating film.

As described above, by forming the first layer thickness adjusting films 32 and the second layer thickness adjusting films 35 in the surface acoustic wave element region 20 of the surface acoustic wave device 1, the step between the IC region 10 and the surface acoustic wave element region 20 can be reduced. Thus, it can be reduced that the step inclines and advances to the surface acoustic wave element region 20 while the layers such as an insulating layer are stacked in the surface acoustic wave element region 20, thus ensuring evenness of the surface acoustic wave element region 20. And further, the surface acoustic wave element 24 can be formed with high dimensional accuracy in the surface acoustic wave element region 20 whose evenness is ensured, thus the surface acoustic wave element 24 having superior characteristics can be obtained.

Further, since the surface acoustic wave excited by the IDT electrodes 22 proceeds in the depth of about one wavelength, if the layer thickness adjusting films are provided so as to traverse the electrode fingers 21 of the IDT electrodes 22, interference or scattering is caused in the surface acoustic wave to attenuate the surface acoustic wave, thus making it difficult to obtain the superior characteristics. Therefore, in the present embodiment, diffused reflection of the surface acoustic wave proceeding in the depth direction can be prevented by providing the first layer thickness adjusting films 32 and the second layer thickness adjusting films 35 substantially in parallel to the electrode fingers 21 of the IDT electrodes 22 with the same pitch.

As described above, the surface acoustic wave element 24 having superior characteristics can be formed, thus providing the surface acoustic wave device 1 having superior characteristics.

Modified Example of Layout Pattern of Layer Thickness Adjusting Films

Figure 5A:
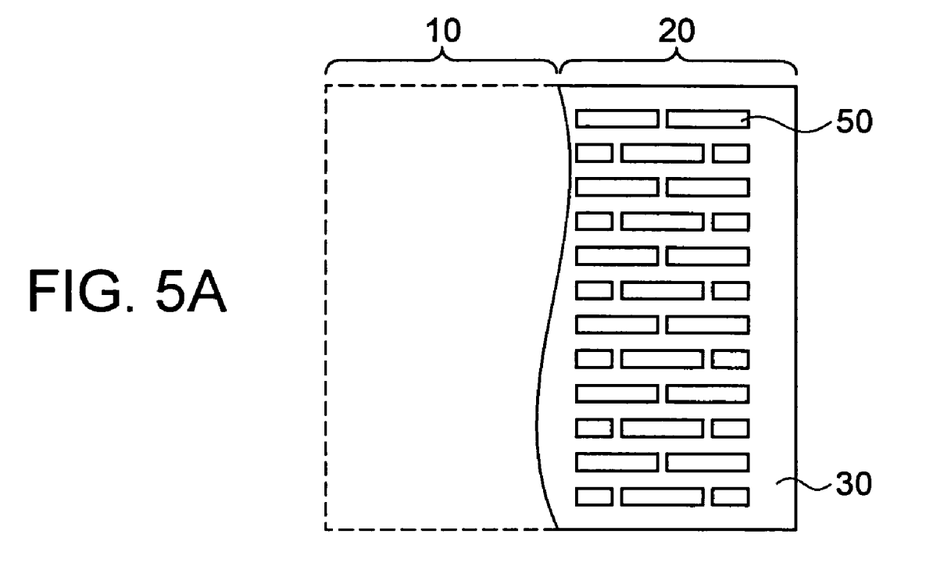
FIGS. 5A and 5B are schematic plan views each showing a layout pattern of another set of the layer thickness adjusting films.
Figure 5B:
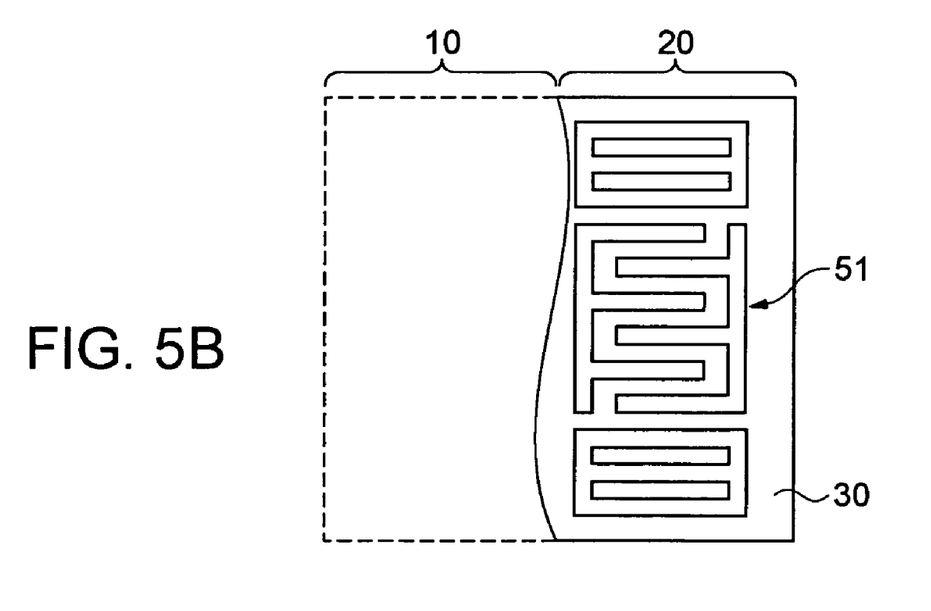

FIGS. 5A and 5B are schematic plan views each showing a modified example of the layout pattern of the set of the layer thickness adjusting films. As the layout pattern of the layer thickness adjusting film, as shown in FIG. 5A, layer thickness adjusting film 50 formed as a pattern composed of discontinuous lines can also be adopted. For example, the first layer thickness adjusting films 50 to be formed in the surface acoustic wave element region 20 of the semiconductor substrate 30 are formed so that each of the layer thickness adjusting films is divided into pieces. Note that the interval sections (the sections without films) are preferably formed so that each of the interval sections is not continued to another one of the interval sections of the adjacent layer thickness adjusting film. According to this arrangement, the layer thickness adjusting films can more easily be formed, and freedom of designing the layer thickness adjusting films can be increased.

Further, as shown in FIG. 5B, layer thickness adjusting films 51 having the same pattern as the surface acoustic wave element can also be adopted. By thus arranged, the photo mask used for forming the surface acoustic wave element can be shared.

Figure 6A:
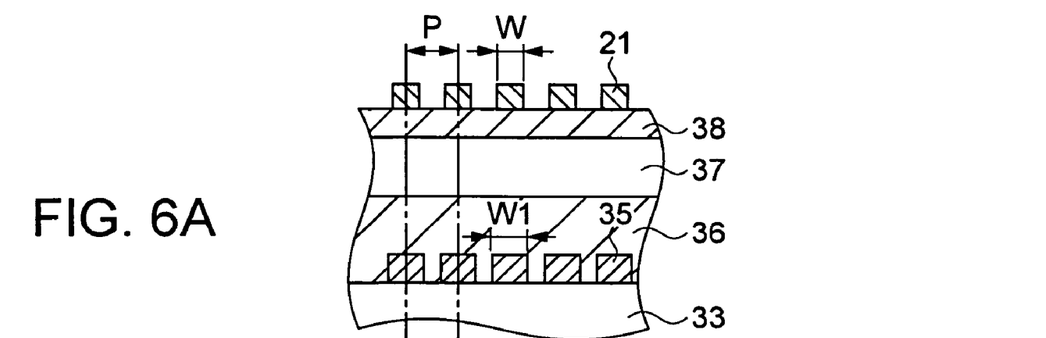
FIGS. 6A through 6C are schematic partial cross-sectional views each showing the positional relationship between another surface acoustic wave element and the layer thickness adjusting films.
Figure 6B:
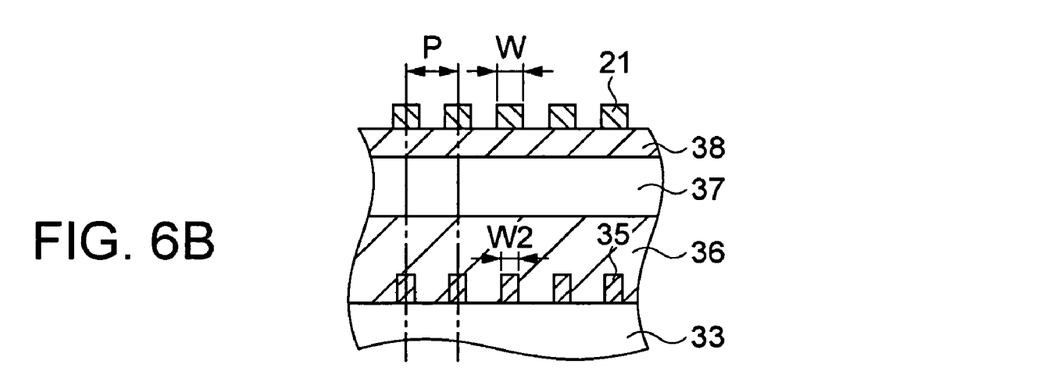
Figure 6C:
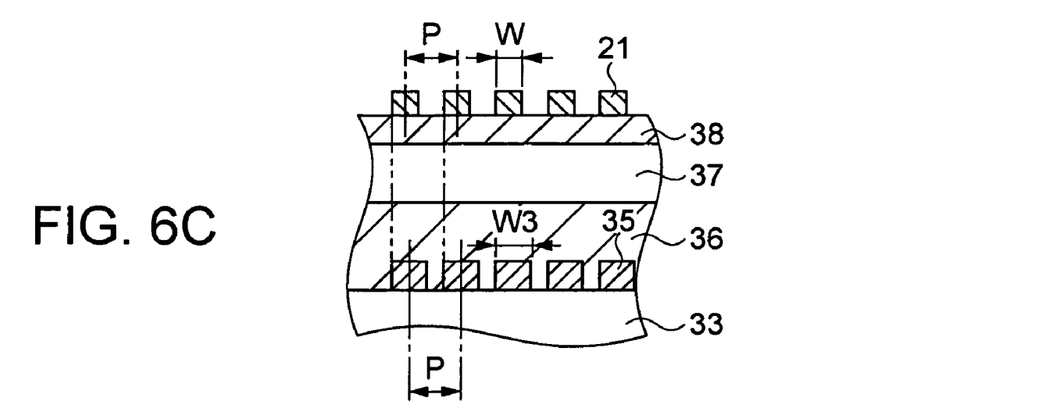

FIGS. 6A through 6C are schematic partial cross-sectional views each showing a modified example of the line width of the layer thickness adjusting films and the positional relationship with the surface acoustic wave element. As shown in FIG. 6A, the layer thickness adjusting films can be formed to have the line width W1 wider than the line width W of the electrode fingers 21. For example, the second layer thickness adjusting films 35 are formed in the same pitch P as the electrode fingers 21 with respect to the positions having the same center lines as the electrode fingers 21 in the direction of the width W, and the layer thickness adjusting films are formed to have the line width W1 wider than the line width W of the electrode fingers 21.

Further, as shown in FIG. 6B, the layer thickness adjusting films can be formed to have the line width W2 narrower than the line width W of the electrode fingers 21. For example, the second layer thickness adjusting films 35 are formed in the same pitch P as the electrode fingers 21 with respect to the positions having the same center lines as the electrode fingers 21 in the direction of the width W, and the layer thickness adjusting films are formed to have the line width W2 narrower than the line width W of the electrode fingers 21.

Further, as shown in FIG. 6C, the layer thickness adjusting films can also be formed to have the same pitch P as the electrode fingers 21, different center lines from those of the electrode fingers 21 in the direction of the width W, and the line width W3 including the line width W of the electrode fingers 21. For example, the second layer thickness adjusting films 35 are formed with the same pitch P as the electrode fingers 21, and the layer thickness adjusting films 35 having the width W3 are disposed in the positions including the respective electrode fingers 21 and have different center lines from those of the electrode fingers 21 in the direction of the width W. Therefore, the layer thickness adjusting films 35 are formed to have the width W3 wider than the width W of the electrode fingers 21.

The structure described above can commonly be adopted to the first layer thickness adjusting films, and the surface acoustic wave proceeding to the depth of about one wavelength can be prevented from being diffusely reflected. Note that, although the present embodiment is described taking the case provided with the moisture resistant film 37 as an example, it can be implemented without the moisture resistant film 37 depending on the package or the use environment of the surface acoustic wave device 1.

Further, if the higher evenness is required to the surface acoustic wave element region 20, a CMP (Chemical Mechanical Polishing) process can be executed after forming the wiring insulating film 36 or the moisture resistant film 37 to obtain evenness with better precision. Alternatively, the evenness with good precision can also be obtained by using glass coated by a spin-coating process (Spin On Glass (hereinafter referred to as SOG)) as the element insulating film 33.

Further, by grounding the layer thickness adjusting films 32 and 35, the surface acoustic wave element 24 can be electromagnetically shielded.

Second Embodiment

Hereinafter, a method of manufacturing the surface acoustic wave device will be described. FIGS. 7A through 7D are views for explaining processes showing a method of manufacturing the surface acoustic wave device according to an embodiment of the invention, and the processes proceed in the order from 7A to 7D.

Figure 7A:
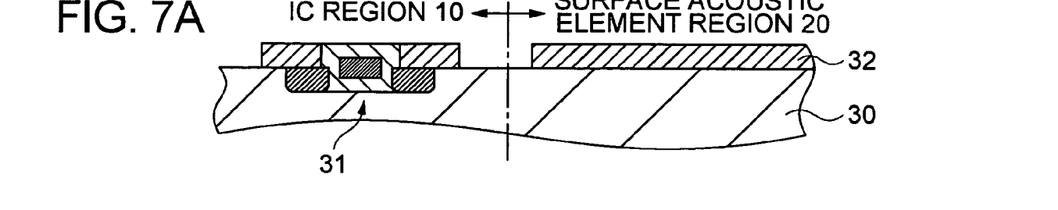
FIGS. 7A through 7D are schematic cross-sectional views for explaining a method of manufacturing the surface acoustic wave device.

In FIG. 7A, using a known method, a large number of semiconductor elements 31 are formed in the IC region 10 on the semiconductor substrate 30 made of silicon. Further, the first layer thickness adjusting films 32 made of Al are formed in the surface acoustic wave element region 20 on the semiconductor substrate 30. The first layer thickness adjusting films 32 are formed linearly and substantially in parallel to the electrode fingers of the IDT electrode of the surface acoustic wave element, as shown in FIG. 4. Further, the first layer thickness adjusting films 32 are formed to have the same pitch and the same line width as the electrode fingers of the IDT electrode.

Figure 7B:
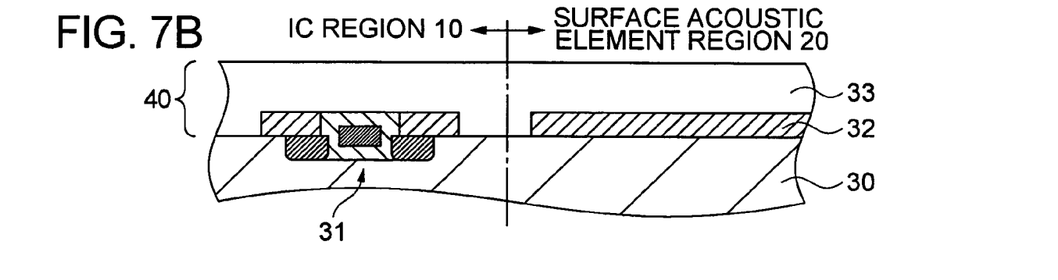

And, as shown in FIG. 7B, the element insulating film 33 made of $SiO_2$ is formed on the semiconductor substrate 30 to insulate the semiconductor element 31. In this case, the element insulating film 33 is formed not only in the IC region 10 but also in the surface acoustic wave element region 20. As described above, a semiconductor element layer 40 composed of the semiconductor elements 31 and the element insulating film 33 is formed in the IC region 10.

Figure 7C:
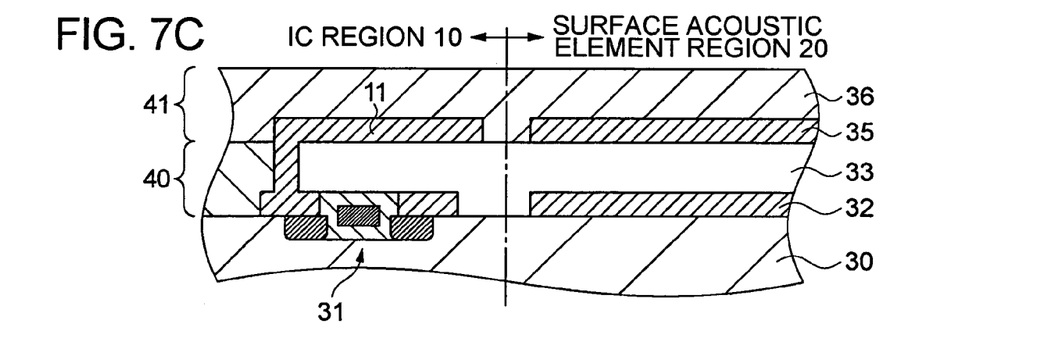

Subsequently, as shown in FIG. 7C, a part of the element insulating film 33 on the semiconductor element 31 in the IC region 10 is removed by etching to form an opening, and then the opening is filled with Al to form the Al wiring 11 electrically connected to the semiconductor element 31. Further, the second layer thickness adjusting films 35 are formed in the surface acoustic wave element region 20 together with the Al wiring 11. The second layer thickness adjusting films 35 are formed linearly and substantially in parallel to the electrode fingers of the IDT electrode of the surface acoustic wave element, similarly to the first layer thickness adjusting films 32. And then, the wiring insulating film 36 made of $SiO_2$ is formed in both the IC region 10 and the surface acoustic wave element region 20 to insulate the Al wiring 11. As described above, a wiring layer 41 composed of the Al wiring 11 and the wiring insulating film 36 is formed in the IC region 10.

Figure 7D:
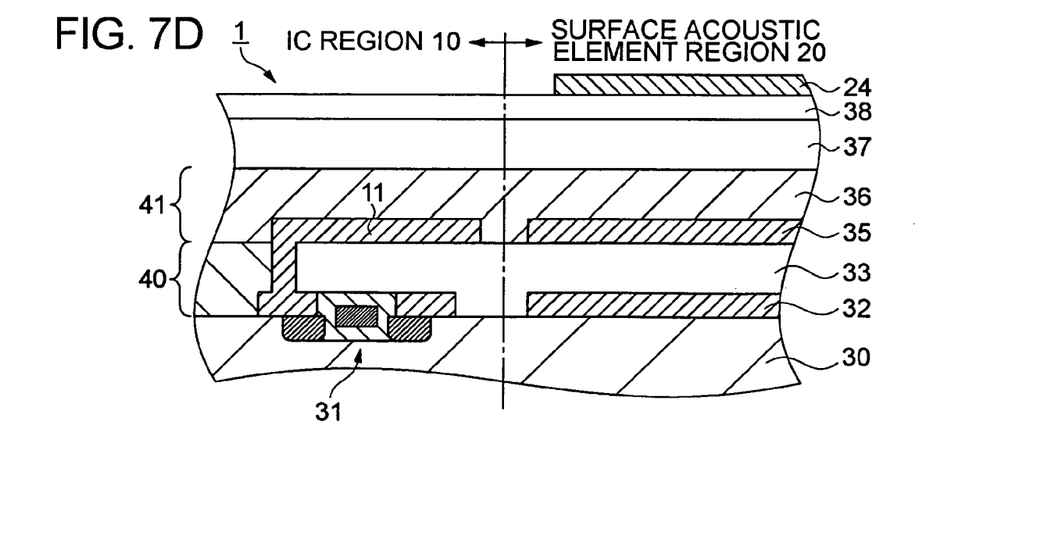

Subsequently, as shown in FIG. 7D, the moisture resistant film 37 made of $Si_3N_4$ is formed in both the IC region 10 and the surface acoustic wave element region 20, thus moisture resistant property of the IC can be enhanced. And then, the piezoelectric thin film 38 made of ZnO is formed on the moisture resistant film 37 in both the IC region 10 and the surface acoustic wave element region 20. After then, the surface acoustic wave element 24 is formed on the piezoelectric thin film 38 in the surface acoustic wave element region 20. The surface acoustic wave element 24 is formed as a SAW resonator equipped with the IDT electrodes 22 and the reflectors 23 shown in FIG. 1. As described above, the semiconductor substrate 30 is equipped with the IC region 10 and the surface acoustic wave element region 20, thus the surface acoustic wave device 1 configured as a single chip can be obtained.

Note that, if the wiring layers are stacked to form a multi-layered structure, the step between the IC region 10 with the multi-layered structure and the surface acoustic wave element region 20 can be reduced by appropriately forming the layer thickness adjusting films having the same shapes as described above on the wiring insulating film. Further, as the layout pattern of the layer thickness adjusting films, the layout patterns described in the modified examples of the first embodiment can also be provided.

As described above, according to the method of manufacturing the surface acoustic wave device of the present embodiment, by forming the first layer thickness adjusting films 32 and the second layer thickness adjusting films 35 in the surface acoustic wave element region 20 of the surface acoustic wave device 1, the step between the IC region 10 and the surface acoustic wave element region 20 can be reduced. Thus, it can be reduced that the step inclines and advances to the surface acoustic wave element region 20 while the layers such as an insulating layer are stacked in the surface acoustic wave element region 20, thus ensuring evenness of the surface acoustic wave element region 20. And further, the surface acoustic wave element 24 can be formed with high dimensional accuracy in the surface acoustic wave element region 20 whose evenness is ensured, thus the surface acoustic wave element 24 having superior characteristics can be obtained.

Further, since the surface acoustic wave excited by the IDT electrodes 22 proceeds to the depth of about one wavelength, the surface acoustic wave proceeding in the depth direction can be prevented from being diffusely reflected by providing the first layer thickness adjusting films 32 and the second layer thickness adjusting films 35 in the same pitch as the electrode fingers 21 of the IDT electrodes 22.

As described above, according to the method of manufacturing the surface acoustic wave device of the embodiment of the invention, the surface acoustic wave element 24 having superior characteristics can be formed, thus making it possible to provide the surface acoustic wave device 1 having superior characteristics.

Third Embodiment

Hereinafter, modified examples of the method of manufacturing the surface acoustic wave device will be described. The element insulating film 33 shown in FIG. 2 or FIG. 7B is often formed using a vapor phase process in response to a higher frequency or finer pitch wiring. However, in the case of a relatively low frequency of no higher than several hundreds MHz, the previous-generation wiring of no smaller than 0.35 µm can be adopted. In this case, by applying SOG to the element insulating film 33, a more low-cost film forming process can be provided. Note that, in the SOG process, liquid glass is deposited on a wafer by spin-coating in a preliminary rotational speed of 300 rpm for 3 seconds, and then in a main rotational speed of 3000 rpm for 10 seconds. After then, it is processed in a baking oven at 80° C. for 3 minutes, and finally cured at 300° C. for 60 minutes to be completed.

As described above, according to the method of manufacturing the surface acoustic wave device of the embodiment of the invention, the surface acoustic wave element 24 having superior characteristics can be formed, thus making it possible to provide the surface acoustic wave device 1 having superior characteristics at a low price.

Note that, although the descriptions are presented in the embodiments using silicon as the material of the substrate, other materials such as Ge, SiGe, SiC, SiSn, PbS, GaAs, InP, GaP, GaN, ZnSe can also be used as an alternative. Further, although the descriptions are presented in the embodiments using ZnO as the material of the piezoelectric thin film, AlN or the like, for example, can also be used as an alternative. Further, although the descriptions are presented in the embodiments regarding the case with the SAW resonator as the surface acoustic wave element, a surface acoustic wave filter can also be configured. Alternatively, a structure having the IDT formed under the piezoelectric thin film can also be adopted.

The entire disclosure of Japanese Patent Application Nos: 2004-368866, filed Dec. 21, 2004 and 2005-247275, filed Aug. 29, 2005 are expressly incorporated by reference herein.

What is claimed is:

1. A surface acoustic wave device including at least an IC region and a surface acoustic wave element region in a semiconductor substrate and formed as a single chip, comprising:
   in the IC region, at least,
      a semiconductor element layer having a semiconductor element and an element insulating film formed to cover the semiconductor element and extending to the surface acoustic wave element region;
      a wiring layer formed by stacking, on the semiconductor element layer, wiring for establishing connection with the semiconductor element and a wiring insulating film extending to the surface acoustic wave element region and for insulating the wiring; and
      a piezoelectric thin film formed above the wiring insulating film, the piezoelectric thin film extending into the surface acoustic wave region and the IC region; and
   in the surface acoustic wave element region,
      a surface acoustic wave element formed on the piezoelectric thin film and equipped with an IDT electrode provided with a plurality of electrode fingers; and
      at least one layer of layer thickness adjusting films having linear shapes and arranged in parallel to and with the same pitch as the electrode fingers of the IDT electrode, and formed above one of the semiconductor substrate, the element insulating film, and the wiring insulating film, and below an area in which the surface acoustic wave element is formed.

2. The surface acoustic wave device according to claim 1, wherein the at least one layer of layer thickness adjusting films is formed in the same pitch as the pitch of the electrode fingers with respect to positions where the center lines of the electrode fingers in the line width direction match the respective center lines of the at least one layer of layer thickness adjusting films in a line width direction.

3. The surface acoustic wave device according to claim 1, wherein the width of each of the electrode fingers is equal to the width of a respective one of the at least one layer of layer thickness adjusting films.

4. The surface acoustic wave device according to claim 1, wherein each of the at least one layer of layer thickness adjusting films has a shape composed of discontinuous lines.

5. The surface acoustic wave device according to claim 1, further comprising a moisture resistant film formed between the wiring insulating film and the piezoelectric thin film.

6. A method of manufacturing a surface acoustic wave device including at least an IC region and a surface acoustic wave element region in a semiconductor substrate and formed as a single chip, comprising:
   (a) forming in the IC region of the semiconductor substrate a semiconductor element layer, the step (a) including:
      (a1) providing a semiconductor element; and
      (a2) providing an element insulating film covering the semiconductor element;
   (b) forming on the semiconductor element layer a wiring layer, the step (b) including:
      (b1) providing wiring for establishing connection with the semiconductor element; and
      (b2) providing a wiring insulating film for insulating the wiring stacked on the wiring,
   wherein the step (a2) including forming in the surface acoustic wave element region the element insulating film composing the semiconductor element layer, and the step (b2) including forming in the surface acoustic wave element region the wiring insulating film composing the wiring layer in a stacked manner;
   (c) forming a piezoelectric thin film above the wiring insulating film, the piezoelectric thin film extending into the surface acoustic wave region and the IC region;
   (d) forming a surface acoustic wave element on the piezoelectric thin film in the surface acoustic wave element region; and
   (e) forming at least one layer of layer thickness adjusting films having linear shapes and arranged in parallel to and with the same pitch as electrode fingers of an IDT electrode above one of the semiconductor substrate, the element insulating film, and the wiring insulating film, and below an area in which the surface acoustic wave element is formed.

7. The method of manufacturing a surface acoustic wave device according to claim 6, wherein the step (b1) and the step (e) are executed simultaneously to form the at least one layer of layer thickness adjusting films with the wiring in the same layer.

8. The method of manufacturing a surface acoustic wave device according to claim 6, further comprising,
   (f) forming a moisture resistant film between the wiring insulating film and the piezoelectric thin film.

* * * * *